US009606308B2

(12) United States Patent
Barwicz et al.

(10) Patent No.: US 9,606,308 B2
(45) Date of Patent: Mar. 28, 2017

(54) THREE DIMENSIONAL SELF-ALIGNMENT OF FLIP CHIP ASSEMBLY USING SOLDER SURFACE TENSION DURING SOLDER REFLOW

(71) Applicant: International Business Machines Corporation, Armonk, NY (US)

(72) Inventors: Tymon Barwicz, Yorktown Heights, NY (US); Yves C. Martin, Ossining, NY (US); Jae-Woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/634,189

(22) Filed: Feb. 27, 2015

(65) Prior Publication Data

US 2016/0252688 A1    Sep. 1, 2016

(51) Int. Cl.
*G02B 6/12* (2006.01)
*G02B 6/42* (2006.01)
*G02B 6/122* (2006.01)
*G02B 6/13* (2006.01)
*H01L 23/00* (2006.01)

(52) U.S. Cl.
CPC ......... *G02B 6/4238* (2013.01); *G02B 6/1225* (2013.01); *G02B 6/13* (2013.01); *H01L 24/00* (2013.01)

(58) Field of Classification Search
CPC . H01L 2224/26135; H01L 2224/26165; H01L 2224/27005; H01L 2224/27015; H01L 24/00; G02B 6/4238; G02B 6/1225; G02B 6/13

USPC ........ 385/14, 50, 52, 129; 369/13.02, 13.32; 257/676
See application file for complete search history.

(56) References Cited

U.S. PATENT DOCUMENTS

| | | | |
|---|---|---|---|
| 5,077,878 A | 1/1992 | Armiento et al. |
| 5,745,631 A | 4/1998 | Reinker |
| 6,511,235 B2 | 1/2003 | Wu et al. |
| 6,643,434 B2 | 11/2003 | Cayrefourcq et al. |
| 8,345,517 B2 | 1/2013 | Hurley et al. |
| 8,913,856 B2 | 12/2014 | Jacobowitz et al. |

(Continued)

FOREIGN PATENT DOCUMENTS

| WO | 2009053542 A1 | 4/2009 |
|---|---|---|
| WO | 2011138057 A3 | 11/2011 |

OTHER PUBLICATIONS

S. Assefa et al., "A 90nm CMOS Integrated Nano-Photonics Technology for 25Gbps WDM Optical Communications Applications," in Proceedings of the IEEE International Electron Devices Meeting (IEDM), Dec. 2012, pp. 33.8.1-33.8.3.

(Continued)

*Primary Examiner* — Kaveh C Kianni
*Assistant Examiner* — Hung Lam
(74) *Attorney, Agent, or Firm* — Louis J. Percello; Ryan, Mason & Lewis, LLP

(57) ABSTRACT

Techniques are provided for flip-chip assembly and packaging of microelectronic, photonics and optoelectronic devices in which three-dimensional alignment of package components is achieved using solder surface tension during a solder reflow process to move one or more package components and align such components in X, Y and Z directions using mechanical stops and chip butting techniques.

20 Claims, 11 Drawing Sheets

(56) References Cited

U.S. PATENT DOCUMENTS

| | | | |
|---|---|---|---|
| 2009/0121331 A1* | 5/2009 | Cruz ................ | H01L 23/49503 257/676 |
| 2011/0267930 A1* | 11/2011 | Hurley .................. | G11B 5/105 369/13.32 |
| 2013/0279311 A1* | 10/2013 | Hurley ................ | B23K 1/0008 369/13.02 |
| 2014/0361200 A1 | 12/2014 | Rudmann et al. | |

OTHER PUBLICATIONS

C. Gunn, "CMOS Photonics for High Speed Interconnects," IEEE Micro, Mar.-Apr. 2006, pp. 58-66, vol. 26, No. 2.

T. Barwicz et al., "Assembly of Mechanically Compliant Interfaces Between Optical Fibers and Nanophotonic Chip," in Proceedings of the 64th Electronic Components and Technology Conference (ECTC), May 2014, pp. 179-185.

M. Nutter et al., "Precise Flip Chip Assembly Using Electroplated AuSn20 and SnAg3.5 Solder," in Proceedings of the 56th Electronic Components and Technology Conference (ECTC), May-Jun. 2006, pp. 1087-1094.

K.P. Jackson et al., "A High-Density, Four Channel, OEIC Transceiver Module Utilizing Planar-Processed Optical Waveguides and Flip-Chip, Solder-Bump Technology," Journal of Lightwave Technology, Jul. 1994, pp. 1185-1191, vol. 12, No. 7.

Q. Tan et al., "Soldering Technology for Optoelectronic Packaging," in Proceedings of the 46th Electronic Components and Technology Conference (ECTC), May 1996, pp. 26-36.

W. Hunziker et al., "Low Cost Packaging of Semiconductor Laser Arrays Using Passive Self-Aligned Flip-Chip Technique on Si Motherboard," Proceedings of the 46th IEEE Electronic Components and Technology Conference, May 1996, pp. 8-12.

* cited by examiner

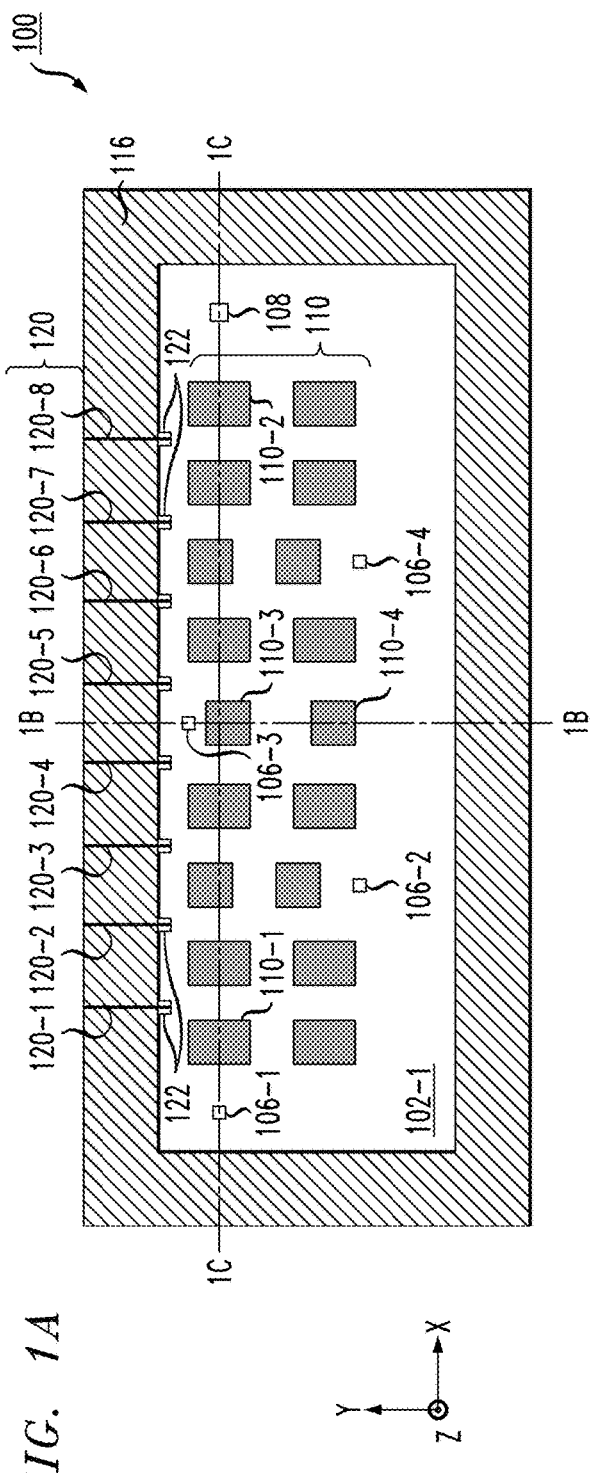
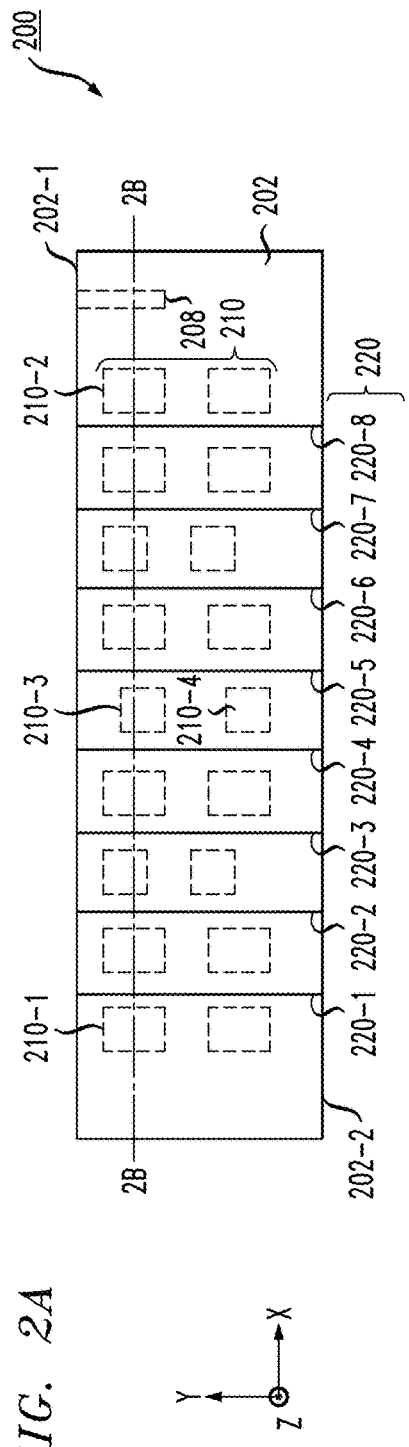
FIG. 1A
FIG. 2A

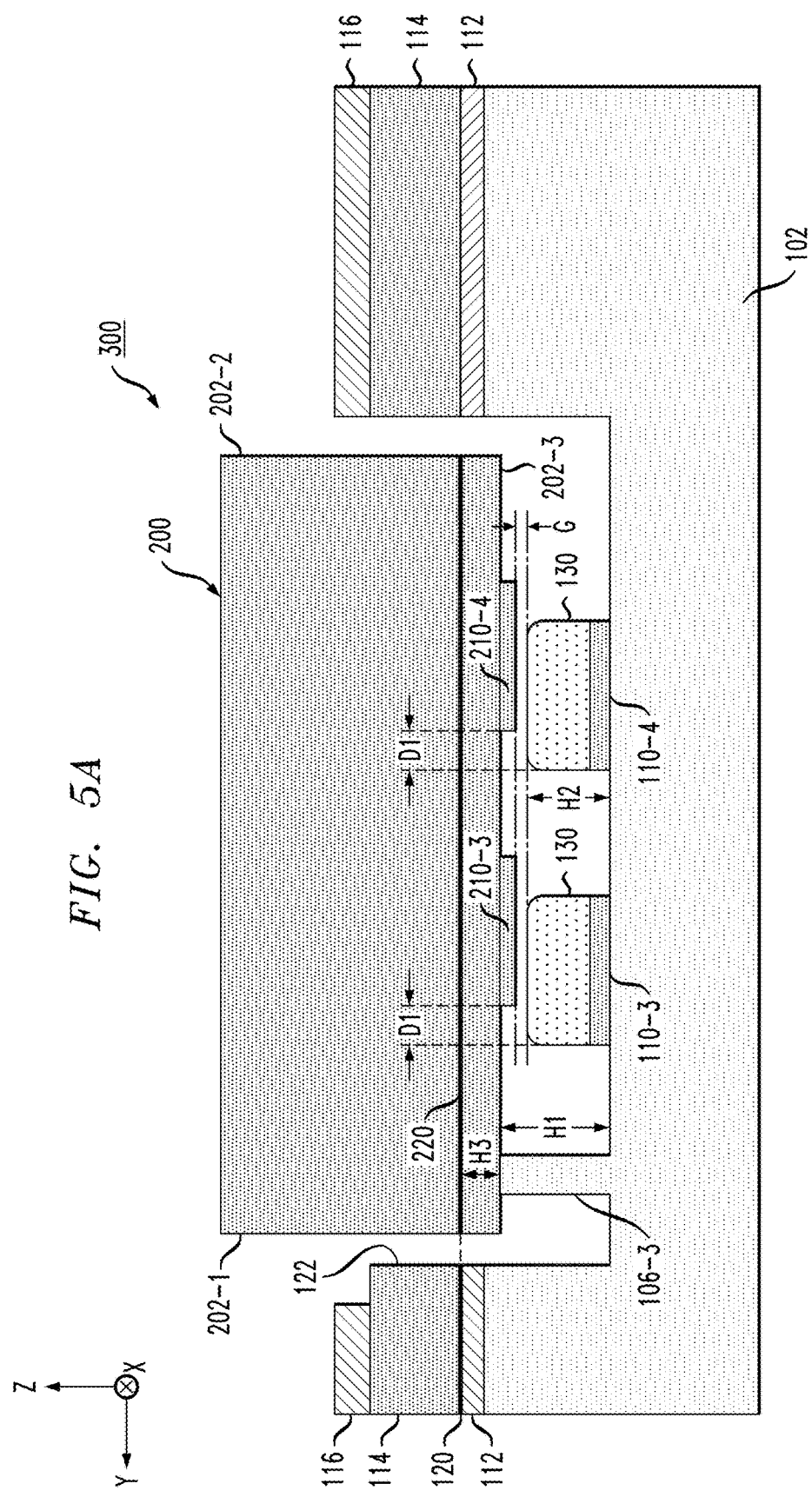

THREE DIMENSIONAL SELF-ALIGNMENT OF FLIP CHIP ASSEMBLY USING SOLDER SURFACE TENSION DURING SOLDER REFLOW

TECHNICAL FIELD

This disclosure generally relates to the assembly of microelectronic, photonic and optoelectronic devices.

BACKGROUND

In general, conventional techniques for assembling flip-chip package structures typically utilize lithographically defined mechanical stops in conjunction with a solder reflow process to align components in one or two dimensions. However, such alignment and packaging techniques can be ineffective to accurately align package components due to various tolerances that exist in certain fabrication and assembly processes. For example, when dicing a wafer into a plurality of similar chips, there can be variations in the size of the diced chips (dies) in a range of +/−15 µm. Moreover, when using high speed pick and place tools for flip-chip assembling, there can be variations in the initial chip (die) placement in a range of +/−10 µm. Such variations in chip sizes and placement can result in misalignment of assembled components when using mechanical stops and solder reflow techniques for alignment.

SUMMARY

In general, embodiments of the invention include devices and methods that enable flip chip assembly of package components using solder surface tension during a solder reflow process to move one or more package components and achieve alignment of the components in multiple dimensions using chip butting and mechanical stops.

In one embodiment of the invention, a method is provided for assembling a semiconductor device having a first and second chip. The first chip comprises a cavity region defined by a recessed surface and a sidewall surface, wherein the first chip comprises an array of first bonding pads formed on the recessed surface of the first chip, wherein solder is disposed on the first bonding pads, wherein the first chip comprises a plurality of vertical standoff structures disposed on the recessed surface of the first chip, and wherein the first chip comprises first circuit components disposed on the sidewall surface. The second chip comprises an array of second bonding pads and an alignment stop formed on a surface of the second chip, wherein the array of second bonding pads corresponds to the array of first bonding pads, and wherein the second chip comprise second circuit components disposed on a side surface of the second chip. The assembly method includes placing the second chip into an initial position in the cavity of the first chip with the array of second bonding pads facing the array of first bonding pads, and with the second chip resting on top of the plurality of vertical standoff structures. In the initial position, the first and second array of bonding pads are misaligned in lateral X and Y directions, and the first and second circuit components are aligned in a vertical Z direction. A solder reflow process is performed to cause the solder on the first bonding pads to contact corresponding ones of the second bonding pads of the second chip and cause the second chip to move in the X and Y directions while sliding along the top surfaces of the vertical standoff structures to thereby align the second circuit components of the second chip with the first circuit components of the first chip in the X, Y and Z directions. The alignment is obtained in the X direction by contact between the alignment stop and at least one of the vertical standoff structures, and the alignment is obtained in the Y direction by contact between the sidewall surface of the first chip and the side surface of the second chip.

In another embodiment of the invention, the first chip comprises a photonics chip and the second chip comprises a semiconductor laser chip. The first circuit components comprise a plurality of semiconductor waveguide structures having inputs exposed on the sidewall surface of the first chip, and wherein the second circuit components comprise semiconductor laser waveguides having outputs exposed on the side surface of the second chip.

These and other embodiments of the invention will be described or become apparent from the following detailed description of embodiments, which is to be read in conjunction with the accompanying drawings.

BRIEF DESCRIPTION OF THE DRAWINGS

FIGS. 1A, 1B, and 1C schematically illustrate a photonics chip according to an embodiment of the invention, wherein FIG. 1A is a schematic top plan view of the photonics chip, FIG. 1B is a schematic cross-sectional side view of the photonics chip along line 1B-1B shown in FIG. 1A, and wherein FIG. 1C is a partial cross-sectional side schematic view of the photonics chip along line 1C-1C shown in FIG. 1A.

FIGS. 2A and 2B schematically illustrate a laser chip according to an embodiment of the invention, wherein FIG. 2A is a schematic top plan view of the laser chip, and FIG. 2B is a schematic cross-sectional side view of the laser chip along line 2B-2B shown in FIG. 2A.

FIGS. 4A and 4B schematically illustrate a method for flip-chip assembling a laser chip and a photonics chip according to an embodiment of the invention, wherein FIG. 4A is a schematic plan view of an assembly comprising the laser chip and the photonics chip when the laser chip is initially placed within a recessed cavity of the photonics chip prior to a solder reflow process, and wherein FIG. 4B is a schematic plan view of the assembly following a solder reflow process in which the laser chip and photonics chip are self-aligned in the X, Y and Z directions.

FIGS. 5A, 5B, and 5C schematically illustrate a process for aligning a laser chip and a photonics chip in Y and Z directions according to an embodiment of the invention, wherein FIGS. 5A and 5B are schematic cross-sectional side views along line L1-L1 shown in FIG. 4A at an initial stage of placement and solder melting/reflow, respectively, and wherein FIG. 5C is a schematic cross-sectional side view along line L2-L2 shown in FIG. 4B which illustrates alignment of the photonics chip and the laser chip in the Y and Z directions at completion of the solder reflow stage.

FIGS. 6A and 6B schematically illustrate a process for aligning a laser chip and a photonics chip in Y and Z directions according to an embodiment of the invention, wherein FIG. 6A is a partial cross-sectional schematic side view along line L3-L3 shown in FIG. 4A at an initial placement stage, and wherein FIG. 6B is a partial cross-sectional schematic side view along line L4-L4 shown in FIG. 4B which illustrates alignment of the photonics chip and the laser chip in the X and Z directions at completion of the solder reflow stage.

DETAILED DESCRIPTION

Embodiments of the invention will now be discussed in further detail with regard to the assembly of microelectronic, photonic and optoelectronic devices using flip-chip packaging techniques in which three-dimensional alignment of package components is achieved using solder surface tension during a solder reflow process to move one or more package components and align such components in X, Y and Z directions using mechanical stops and chip butting techniques.

While embodiments of the invention can be utilized in various applications in which flip-chip assemblies are constructed, for purposes of illustration, exemplary embodiments of the invention will be discussed in the context of optical applications in which three-dimensional alignment is achieved to align waveguide structures of a laser chip and a photonics chip using solder surface tension during solder reflow to move the laser chip into alignment with the photonics chip using chip butting and mechanical stops.

As explained in detail below, during solder reflow, surface tension forces of a melted solder can move a chip by more than one hundred μm. We use these motions to obtain self-alignment by constraining the motions to lithographically defined mechanical stops and chip surface/edge butting. For example, in one embodiment of the invention, alignment in a Y (lateral) direction is obtained by contacting an emitting facet of a laser chip with receiving waveguides of a photonics chip. A plurality of vertical standoff structures are integrated in a substrate of the photonics chip to provide support and alignment of the laser chip and photonics chip in the Z (vertical) direction. Moreover, alignment in an X (lateral) direction is obtained by contacting a protruding lithographically defined alignment stop (which is integrated on a surface of the laser chip) with at least one of the vertical standoff structures of the substrate during the solder reflow process.

Exemplary embodiments of the invention can be implemented in conjunction with standard high-speed pick and place tooling followed by standard solder reflow for high-accuracy flip chip assembly. Again, while example embodiments are described with reference to aligning an InP laser flip-chip assembly to a Si nanophotonic chip, the techniques described herein can be applied to any flip-chip assembly requiring high alignment accuracy.

Figure 1B:
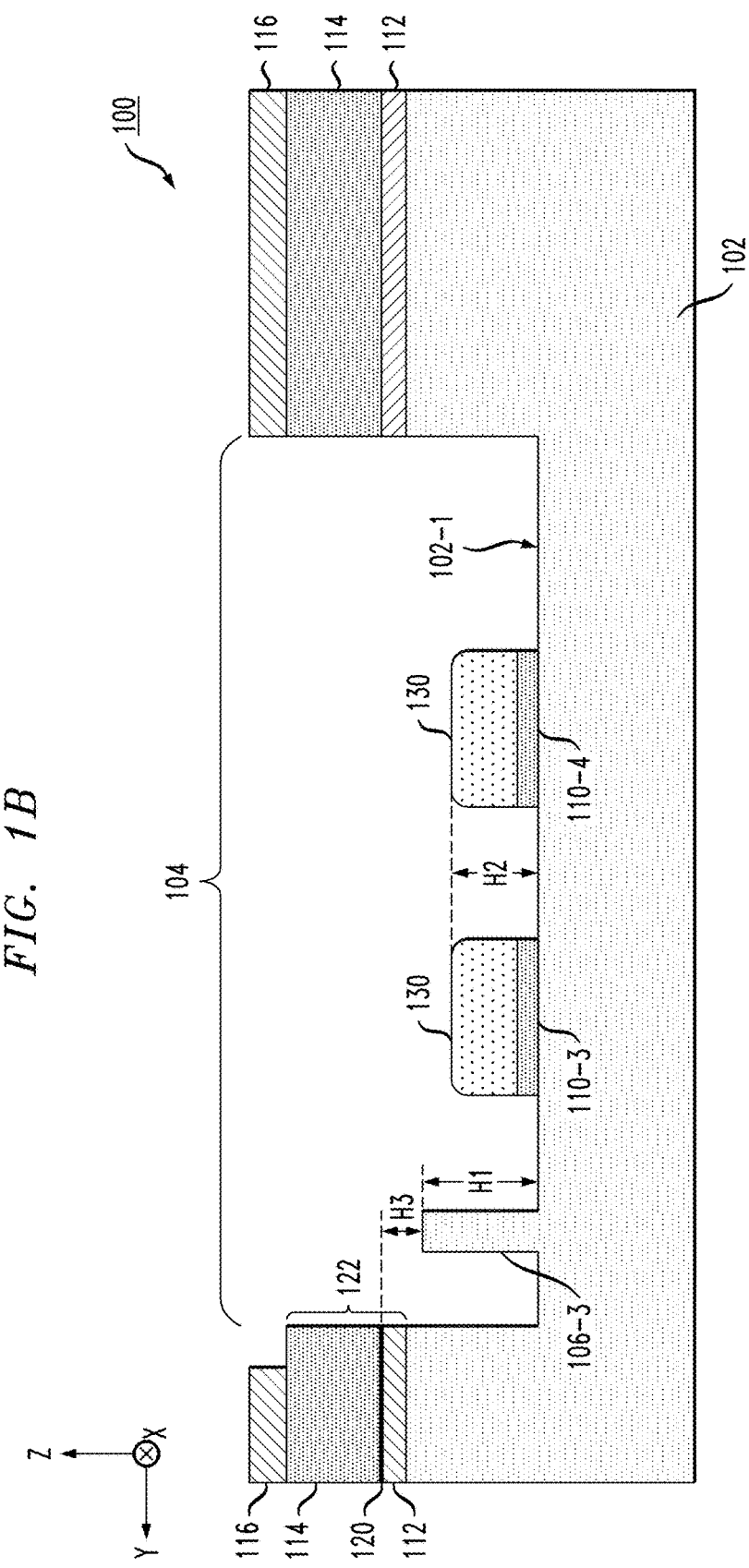
Figure 1C:
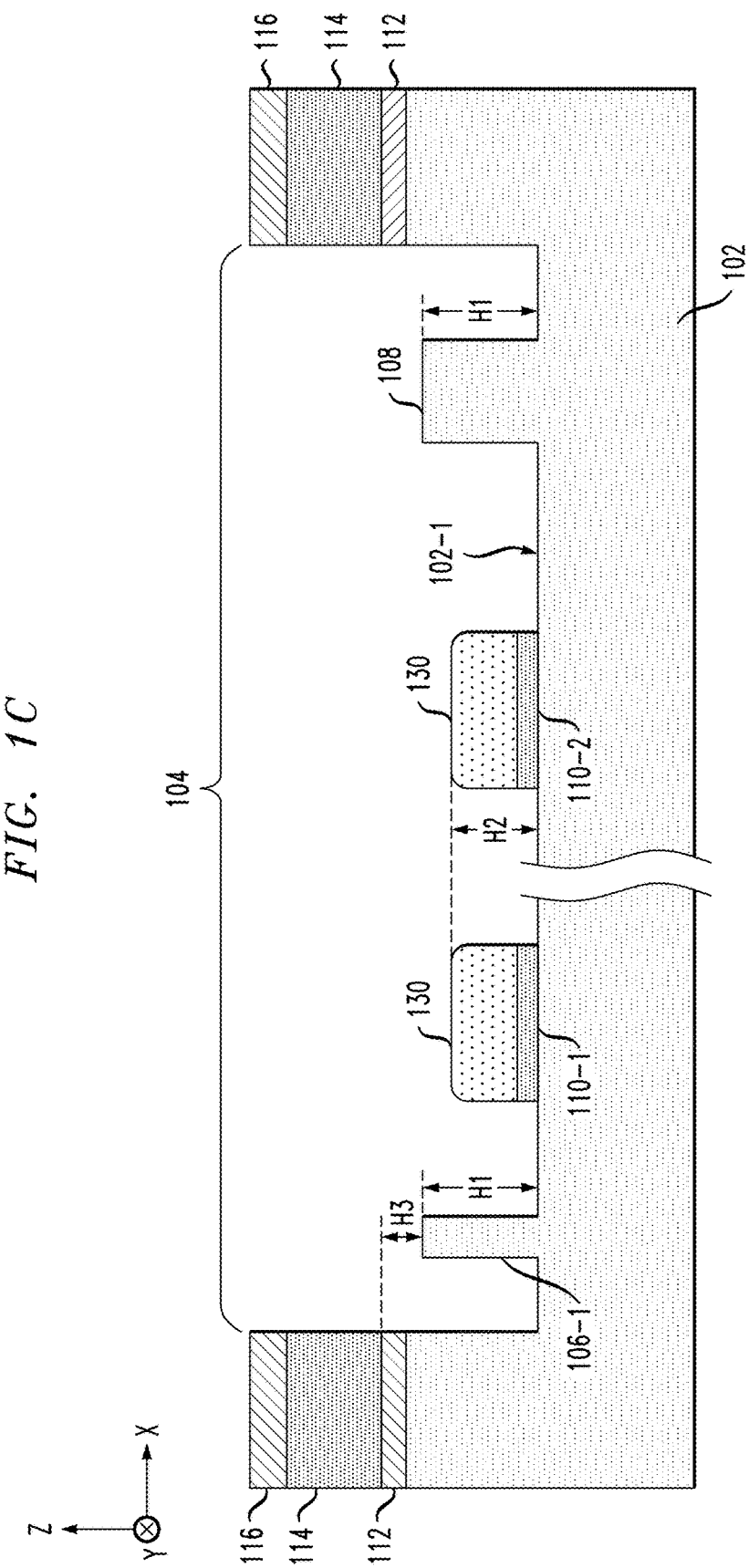
Figure 2B:
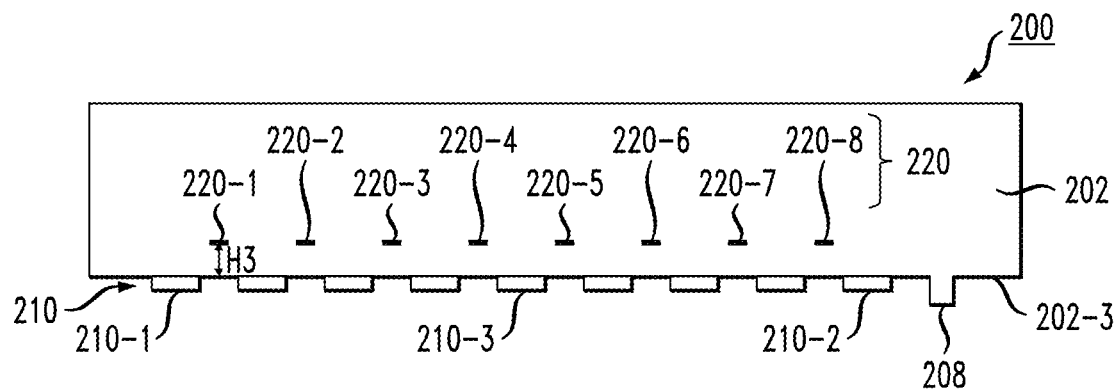

FIGS. 1A, 1B, and 1C schematically illustrate a photonics chip 100 (e.g., nanophotonics chip) according to an embodiment of the invention. In particular, FIG. 1A is a schematic top plan view of the photonics chip 100, FIG. 1B is a schematic cross-sectional side view of the photonics chip 100 along line 1B-1B shown in FIG. 1A, and FIG. 1C is a partial cross-sectional side schematic view of the photonics chip along line 1C-1C shown in FIG. 1A. FIGS. 2A and 2B schematically illustrate a laser chip 200 according to an embodiment of the invention. In particular, FIG. 2A is a schematic top plan view of the laser chip 200, and FIG. 2B is a schematic cross-sectional side view of the laser chip 200 along line 2B-2B shown in FIG. 2A.

Referring collectively to FIGS. 1A, 1B and 1C, the photonics chip 100 comprises a substrate 102 (e.g., silicon substrate) having a recessed surface 102-1 within an etched cavity region 104 of the photonics chip 100. A plurality of vertical standoff structures 106-1, 106-2, 106-3, 106-4, and 108 are disposed on the recessed surface 102-1 of the cavity region 104. As shown in FIGS. 1B and 1C, the vertical standoff structures 106-1, 106-2, 106-3, 106-4, and 108 are formed with a height H1 above the recessed surface 102-1 of the substrate 102. In one embodiment of the invention, the vertical standoff structures 106-1, 106-2, 106-3, 106-4, and 108 are formed using standard lithographic and etching techniques during formation of the recessed cavity region 104.

As discussed in further detail below, the vertical standoff structures 106-1, 106-2, 106-3, 106-4, and 108 are configured to make contact with a surface of the laser chip 200 during assembly and, therefore, serve as vertical standoffs (or posts) for Z-direction alignment during flip-chip assembly of the laser chip 200 and photonics chip 100. Moreover, as explained below, the vertical standoff structure 108 further serves as a mechanical stop for X-direction alignment during flip-chip assembly of the laser chip 200 and photonics chip 100.

In one embodiment of the invention, the vertical standoff structure 108 (which is used for X-direction alignment) is made larger (in cross-sectional contact area) than the other vertical standoff structures 106-1, 106-2, 106-3, and 106-4, so as to effectively withstand a lateral force that is applied to the vertical standoff structure 108 during X-direction alignment. The other vertical standoff structures 106-1, 106-2, 106-3, and 106-4 are made relatively smaller (in cross-sectional contact area) to minimize resistance as the surface of the laser chip 200 slidably moves in X and Y lateral directions on top of the vertical standoff structures 106-1, 106-2, 106-3, and 106-4. For example, the vertical standoff structure 108 can have a cross-sectional area of 50 μm×50 μm, while the other vertical standoff structures 106-1, 106-2, 106-3, and 106-4 can be formed with a cross-sectional area of 30 μm×30 μm.

As further shown in FIGS. 1A, 1B, and 1C, a first array of bonding pads 110 is formed on the recessed surface 102-1 of the substrate 102. The first array of bonding pads 110 comprises a plurality of metallic bonding pads (such as metallic bonding pads 110-1, 110-2, 110-3, and 110-4 as specifically labeled for purposes of discussion). In one embodiment of the invention, the first array of bonding pads 110 is formed using standard UBM (under bump metallization) techniques, wherein the metallic bonding pads can be formed of Ni, Cu, or Au, or a combination thereof (e.g., 1 μm Ni/0.2 μm Cu/0.1 μm Au).

The photonics chip 100 further comprises a first insulating layer 112 (e.g., silicon oxide layer), a plurality of waveguides 120, a BEOL (back end of line) structure 114, and a second insulating layer 116 (e.g., polyimide layer) formed on an upper surface of the substrate 102 outside of the recessed cavity region 104. As shown in FIG. 1A, the plurality of waveguides 120 include separate waveguides 120-1, 120-2, 120-3, 120-4, 120-5, 120-6, 120-7, and 120-8. In one embodiment of the invention, the waveguides 120-1, 120-2, 120-3, 120-4, 120-5, 120-6, 120-7, and 120-8 are single-mode silicon waveguide structures. As shown in FIG. 1B, the waveguides 120 are disposed at a vertical height H3 above a top surface of the vertical standoff structures (e.g., vertical standoff 106-3).

As further shown in FIG. 1A, each waveguide 120-1, 120-2, 120-3, 120-4, 120-5, 120-6, 120-7, and 120-8 has a waveguide input that is located at an edge of a corresponding one of a plurality of protruding waveguide portions 122. These protruding portions 122 are formed by etching/patterning the layers 112, 120, and 114 along one edge region of the recessed cavity 104. The protruding waveguide portions 122 provide a waveguide input interface.

Figure 3:
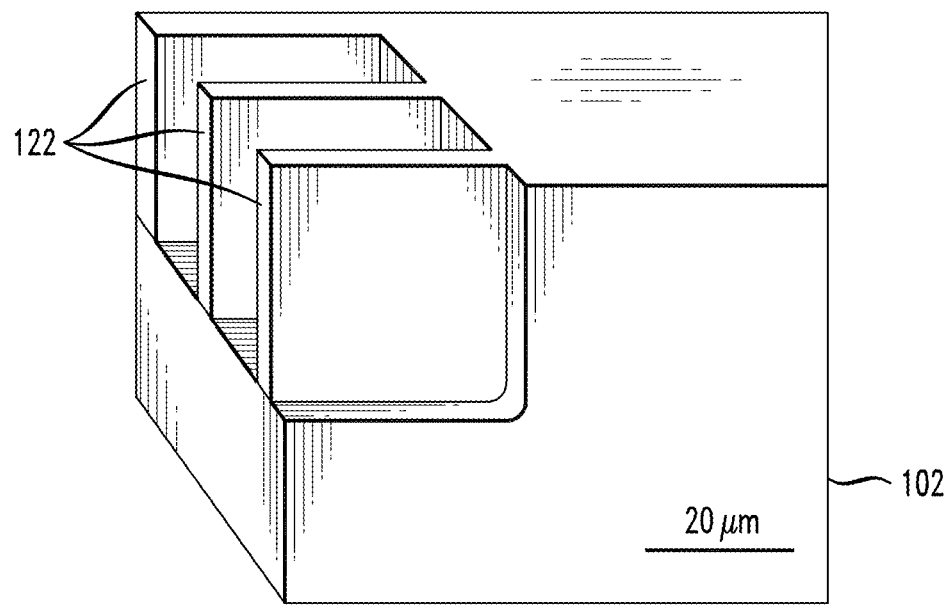
FIG. 3 is a perspective view showing a waveguide input interface for waveguides formed on the photonics chip of FIG. 1A.

In particular, FIG. 3 is a perspective view showing a plurality of protruding waveguide portions 122 providing a waveguide input interface for the waveguides 120 of the photonics chip 100. In one embodiment of the invention, the protruding waveguide portions 122 are formed by RIE (reactive ion etching) the first insulating layer 112, the silicon waveguide layer 120 and the BEOL layer 114 to form the pattern of protruding waveguide portions 122, each aligned to an input of a corresponding one of the waveguides 120. The protruding waveguide portions 122 form a waveguide input interface. Moreover, as explained below, the protruding waveguide portions 122 serve as mechanical stops for Y-direction alignment in which a cleaved edge (side surface) of the laser chip 200 is butted up against the protruding waveguide portions 122 during flip-chip assembly and alignment of the laser chip 200 and the photonics chip 100.

As further shown in FIGS. 1B and 1C, to enable flip-chip bonding of the laser chip 200 to the photonics chip 100, solder 130 is formed on at least some or all of the metallic bonding pads (e.g., bonding pads 110-1, 110-2, 110-3, and 110-4, as specifically shown) of the first array of bonding pads 110. In one embodiment of the invention, solder 130 is deposited on the bonding pads 110 using, e.g., an electroplating process. In one embodiment of the invention, the solder 130 is formed of Sn and Ag, e.g., Sn-0.6 wt % Ag.

Next, as collectively shown in FIGS. 2A and 2B, the laser chip 200 comprises a substrate 202 (e.g., silicon substrate) having a first side edge 202-1, and second side edge 202-2 and a bottom surface 202-3. An alignment stop 208 is lithographically formed on the bottom surface 202-3 of the substrate 202. As explained in further detail below, the alignment stop 208 serves as a mechanical stop against which the vertical standoff structure 108 makes contact for X-direction alignment during flip-chip assembly of the laser chip 200 and the photonics chip 100. In one embodiment of the invention, the alignment stop 208 is formed with a width of about 50 µm and a length of about 200 µm.

As further shown in FIGS. 2A and 2B, a second array of bonding pads 210 are formed on the bottom surface 202-3 of the substrate 202 of the laser chip 200. The second array of bonding pads 210 comprise a plurality of metallic bonding pads (such as metallic bonding pads 210-1, 210-2, 210-3, and 210-4 as specifically labeled for purposes of discussion), which are matched to corresponding ones of the metallic bonding pads of the first array of bonding pads 110 formed on the recessed surface 102-1 of the substrate 102 of the photonics chip 100. In one embodiment of the invention, the second array of bonding pads 210 are formed using standard UBM techniques, wherein the metallic bonding pads can be formed of Ni, Cu, or Au, or a combination thereof (e.g., 1 µm Ni/0.2 µm Cu/0.1 µm Au).

It is to be noted that the term "bonding pad" as used herein refers to corresponding bonding pads 110 and 210 that are used for flip-chip bonding a first chip (e.g., laser chip 200) to a second chip (e.g., photonics chip 100) using solder 130 connections. A soldered pair of corresponding bonding pads 110/210 can be a passive structure that simply serves as a structural flip-chip bond between the chips. In addition, a soldered pair of corresponding bonding pads 110/210 can serve not only as a structural bond, but also serve as an electrical connection (power, ground, I/O signals, etc.) between the chips. Moreover, depending on the application, other metallic pads may exist on the surfaces of the chips that are not actually used for flip-chip bonding.

As explained in further detail below, a critical parameter in the flip-chip assembly process is the amount of solder 130 that is deposited on the metallic bonding pads 110. In one embodiment of the invention, the solder 130 is formed on the metallic bonding pads (e.g., bonding pads 110-1, 110-2, 110-3, and 110-4) so that an overall height H2 of the solder 130 and associated bonding pad 110 is less than the height H1 of the vertical standoff structures 106, 108. This relative height differential (H1–H2) provides a gap G between the top of the solder 130 and metallic bonding pads 210 formed on the laser chip 200. As explained below, this gap is critical to generate self-alignment forces in each of the X, Y and Z directions due to solder surface tensions during a solder reflow process in which the laser chip 200 is flip-chip assembled to the photonics chip 100.

Referring again to FIGS. 2A and 2B, the laser chip 200 further comprises a plurality of laser waveguides 220, e.g., laser waveguides 220-1, 220-2, 220-3, 220-4, 220-5, 220-6, 220-7, and 220-8. The laser waveguides 220 are formed within the substrate 202 of the laser chip 200 and extend from the first side edge 202-1 to the second side edge 202-2 of the laser chip 200. The light emitting ends of the laser waveguides 220 are located at the first side edge 202-1 of the laser chip 200, and the non-emitting ends of the laser waveguides 220 are located at the second side edge 202-1 of the laser chip 200. In one embodiment of the invention, the laser chip 200 comprises edge-emitting lasers, wherein laser light propagates in a direction along the waveguides 220 of the semiconductor laser chip 200 and is reflected or coupled out from the cleaved edge (e.g., the first side edge 202-1) at the light-emitting ends of the waveguides 220.

Figure 4A:
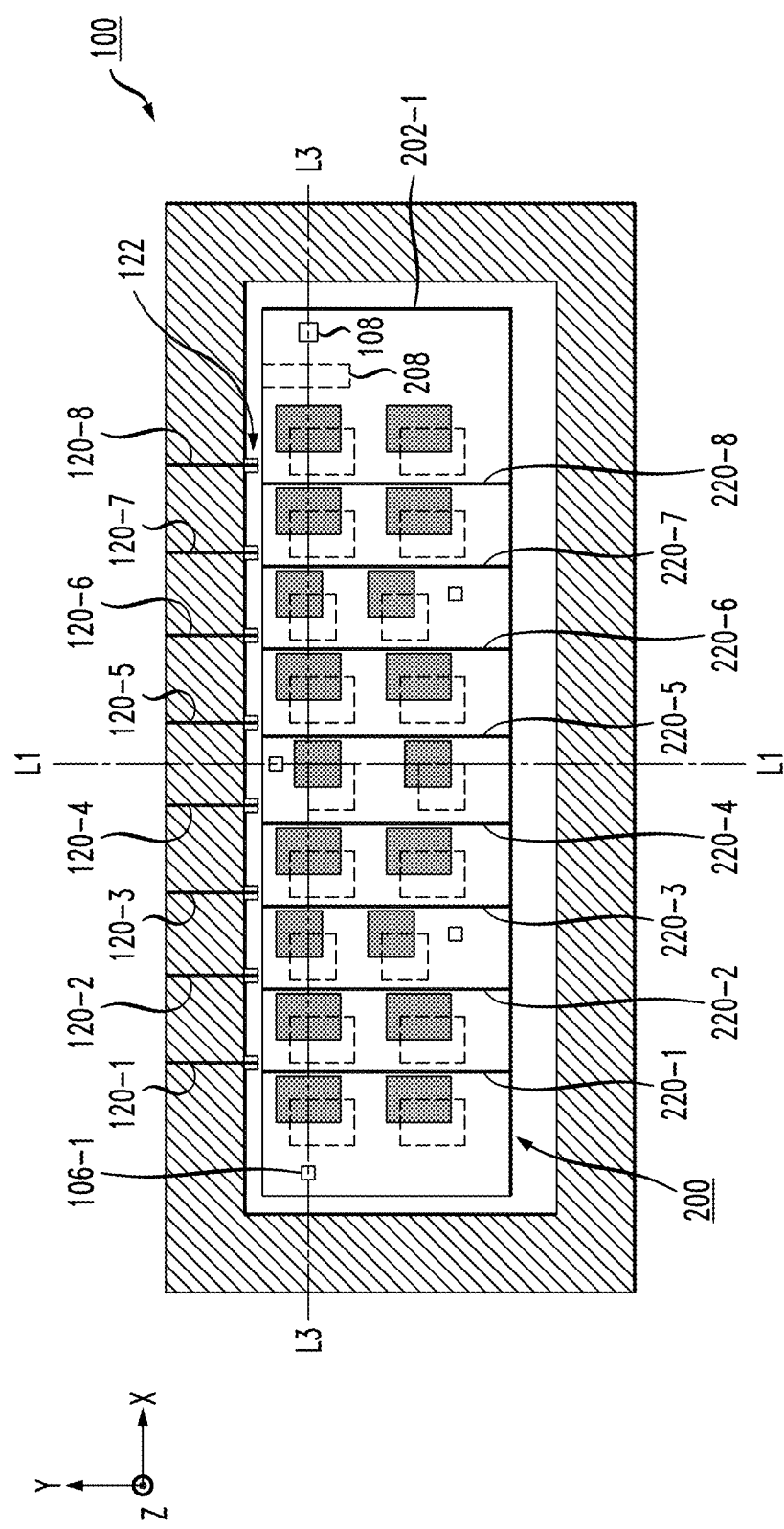
Figure 4B:
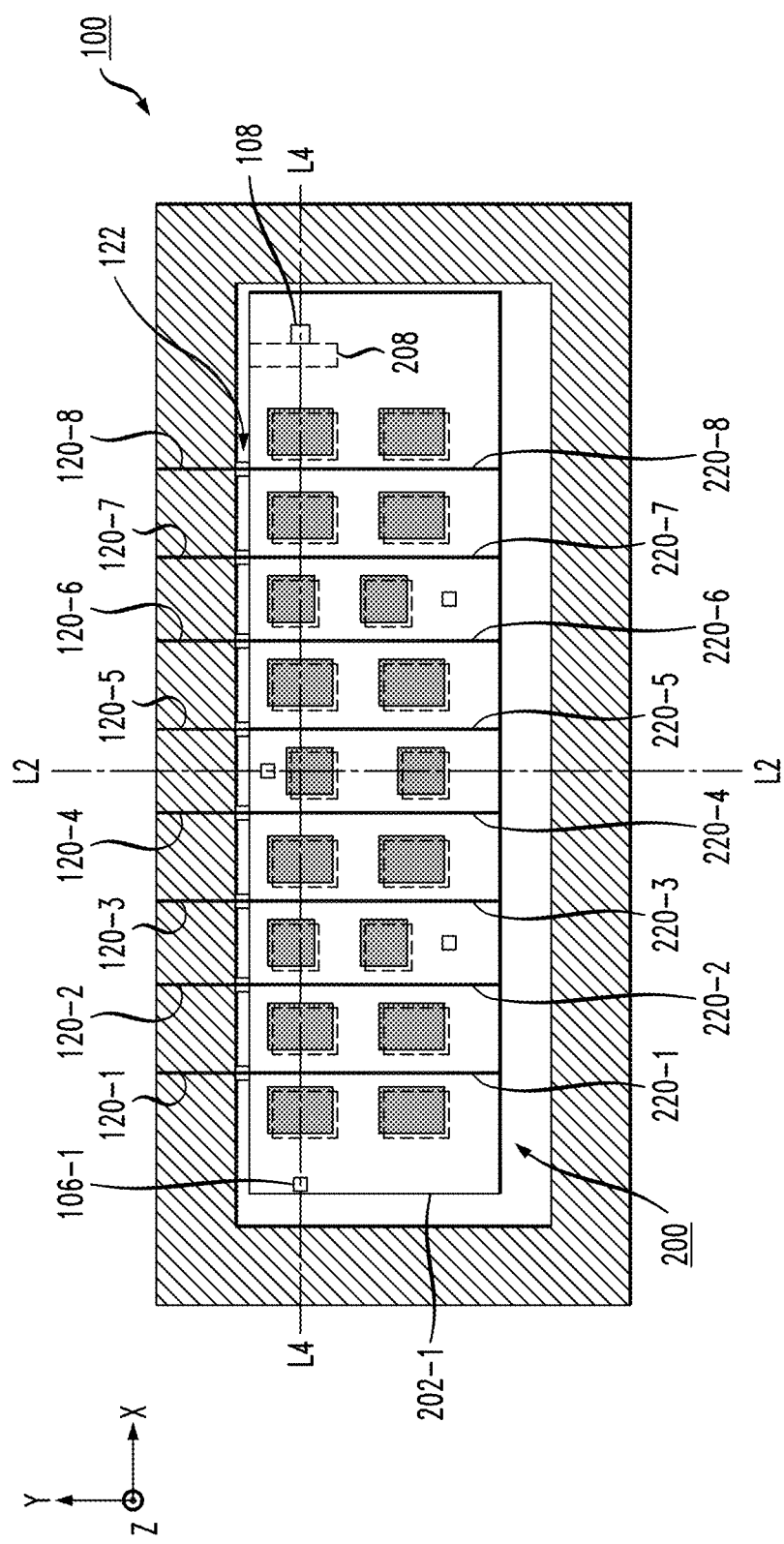

Exemplary methods for flip-chip assembling the laser chip 200 to the photonics chip 100 according to embodiments of the invention will now be discussed in further detail with reference to FIGS. 4A, 4B, 5A, 5B, 5C, 6A and 6B. FIG. 4A is a schematic plan view of an assembly 300 comprising the laser chip 200 and the photonics chip 100, wherein the laser chip 200 is initially placed within the recessed cavity 104 of the photonics chip 100 prior to a solder reflow process. FIG. 4B is a schematic plan view of the assembly 300 following a solder reflow process in which the laser chip 200 and photonics chip 100 are self-aligned in the X, Y and Z directions.

Figure 5B:
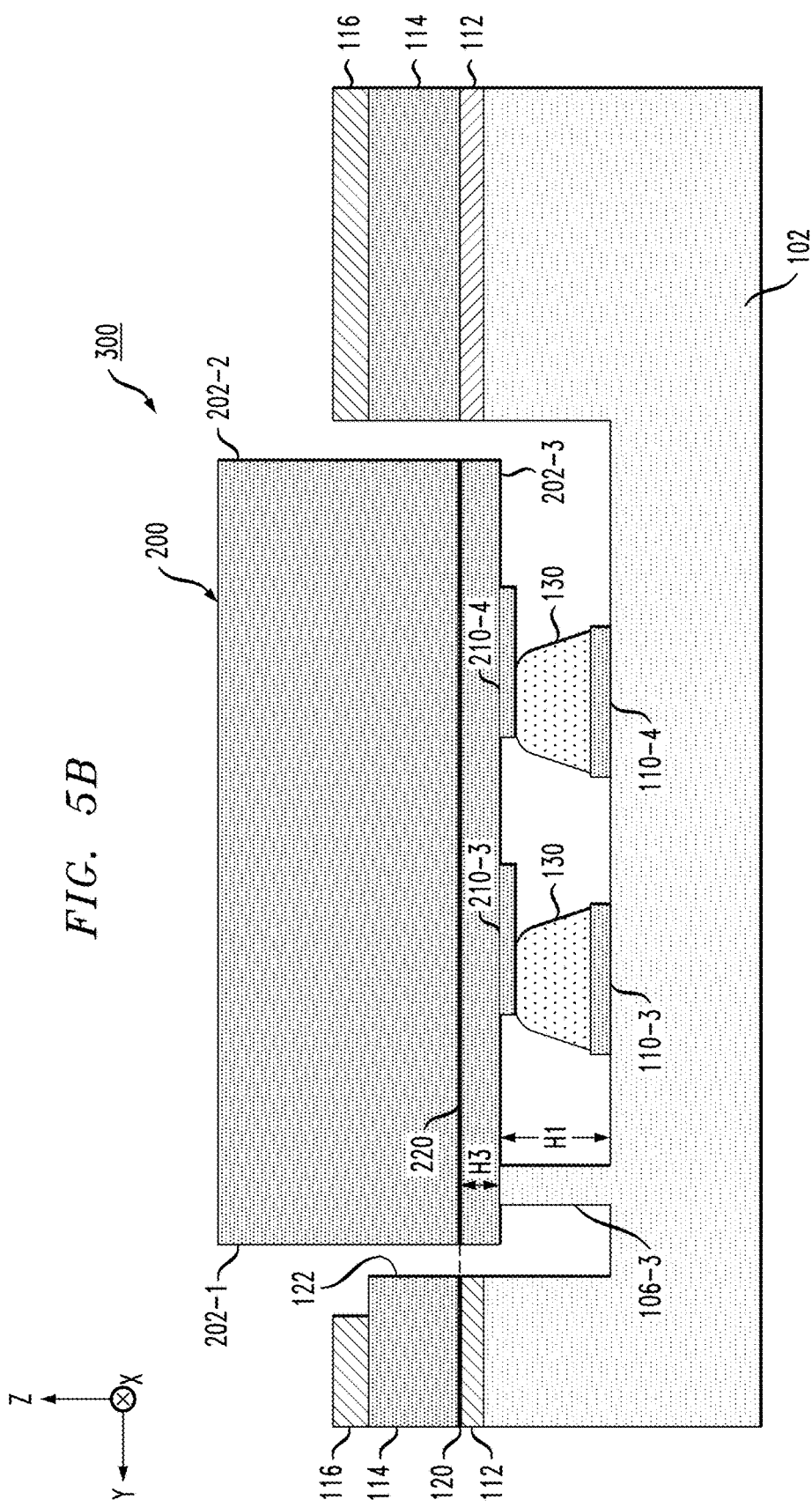
Figure 5C:
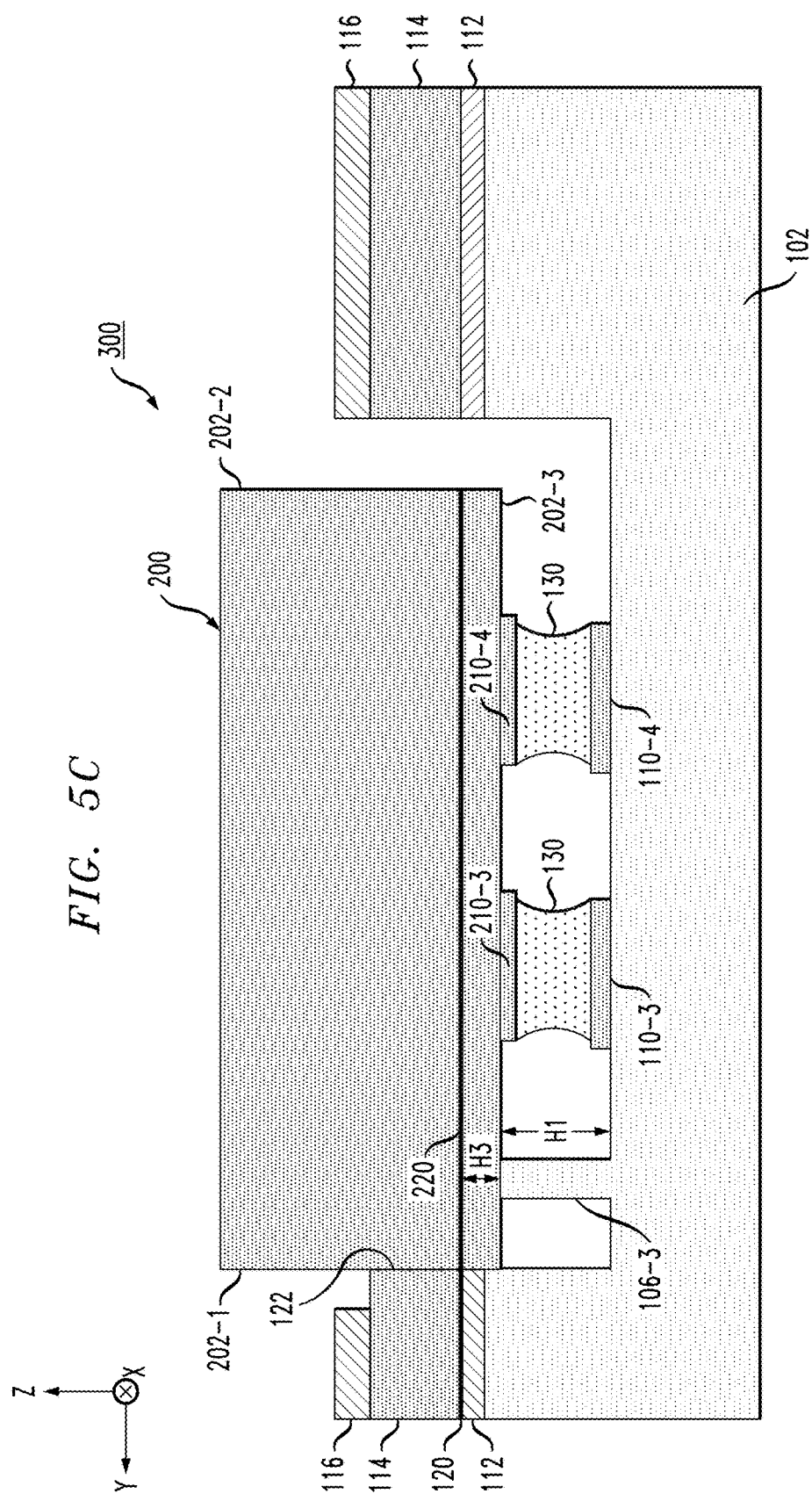

Moreover, FIGS. 5A, 5B, and 5C schematically illustrate positions of the laser chip 200 in the Y and Z directions relative to the photonics chip 100 at different stages in the assembly process. In particular, FIG. 5A is a schematic cross-sectional side view of the assembly 300 along line L1-L1 shown in FIG. 4A, which illustrates the initial position of the laser chip 200 in the Y and Z directions relative to the photonics chip 100 following an initial placement stage in which the laser chip 200 is initially placed within the recessed cavity 104 of the photonics chip 100. FIG. 5B is a schematic cross-sectional side view of the assembly 300 along line L1-L1 shown in FIG. 4A, which illustrates a position of the laser chip 200 in the Y and Z directions relative to the photonics chip 100 at an initial stage of a solder melting and reflow process. FIG. 5C is a schematic cross-sectional side view of the assembly 300 along line L2-L2 shown in FIG. 4B following completion of the solder reflow process in which the photonics chip 100 and laser chip 200 are self-aligned to each other at target positions in the Y and Z directions.

Figure 6A:
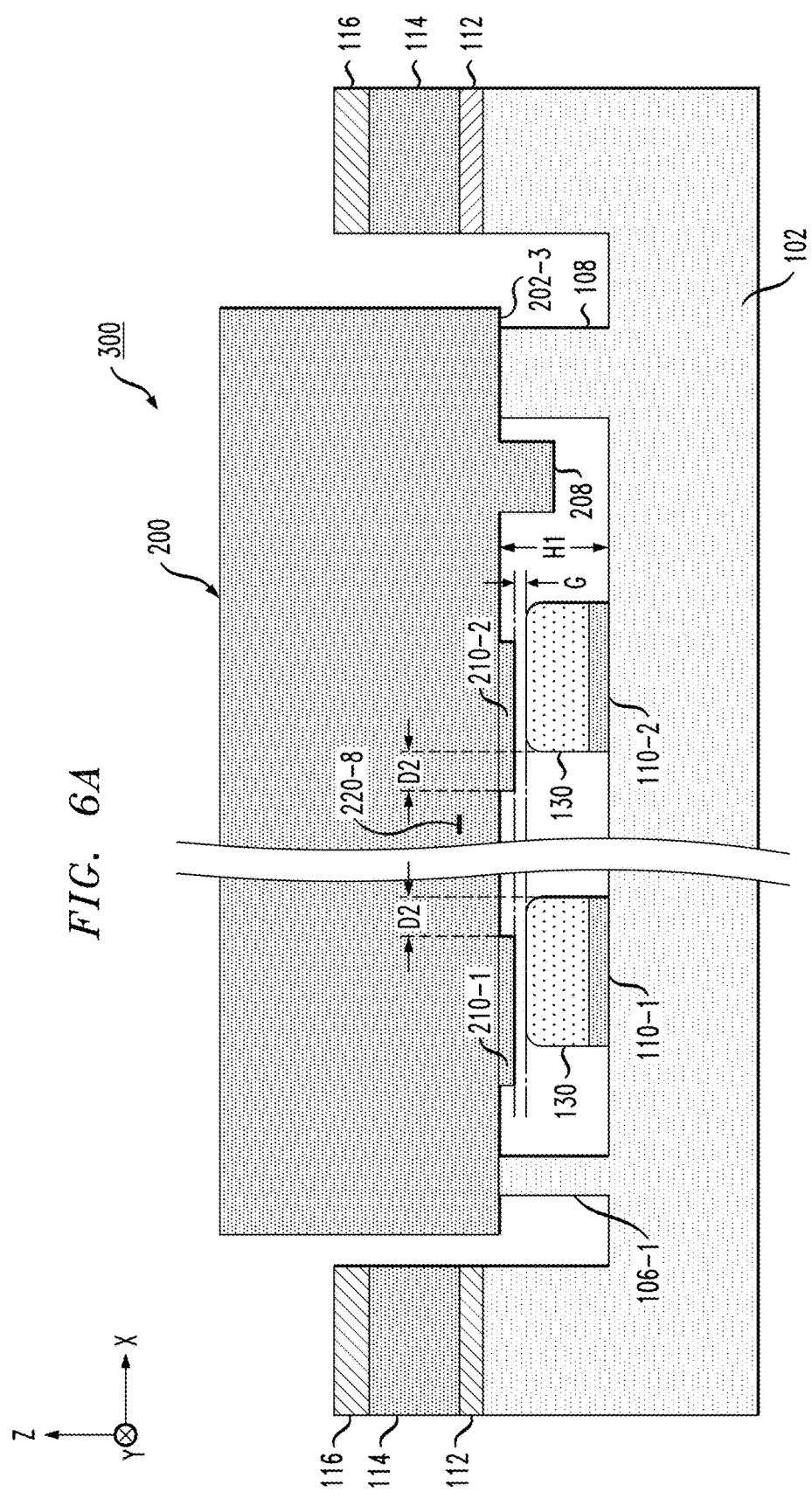
Figure 6B:
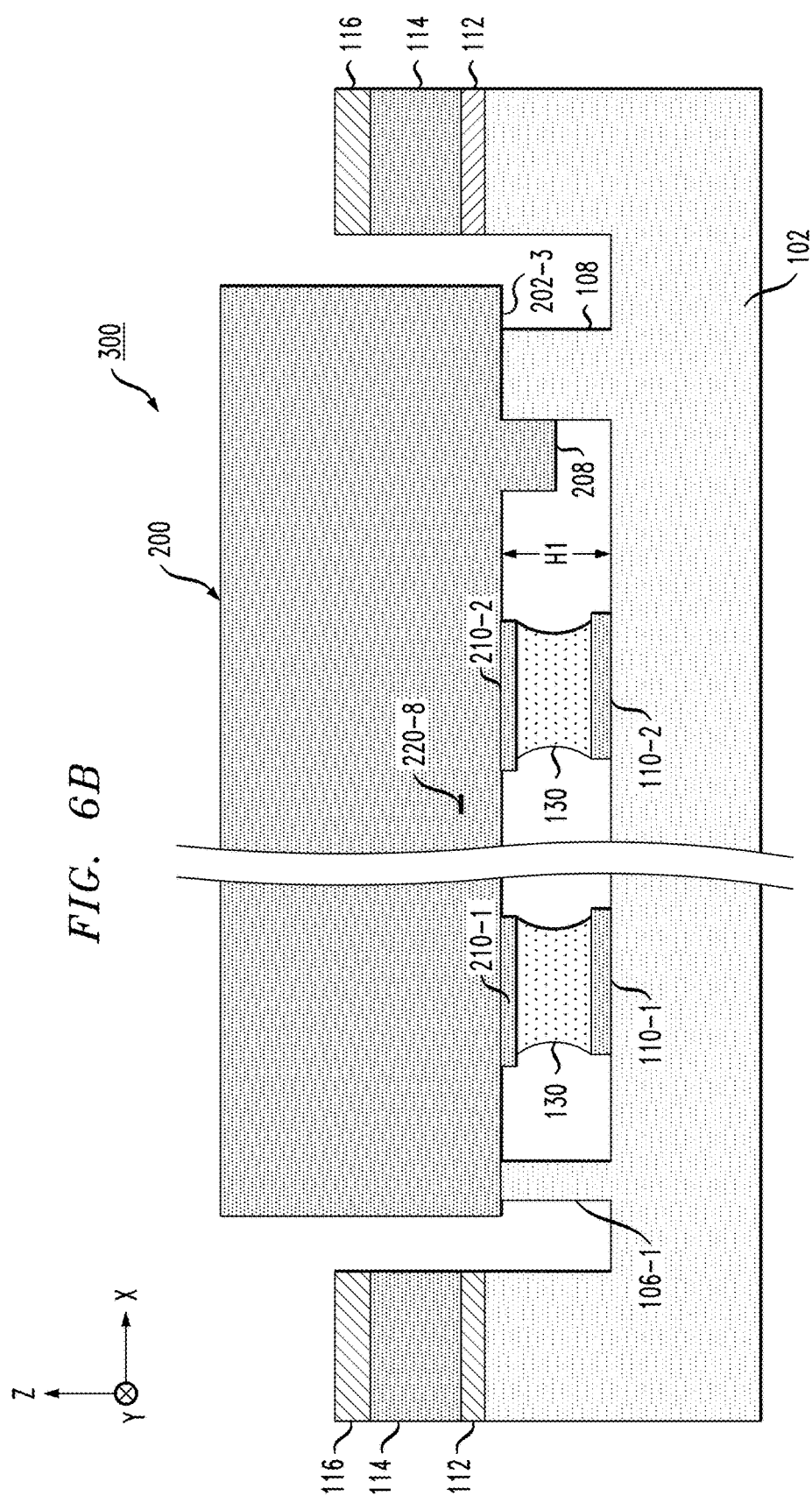

Furthermore, FIGS. 6A and 6B schematically illustrate positions of the laser chip 200 in the X and Z directions relative to the photonics chip 100 at different stages in the assembly process. In particular, FIG. 6A is a partial cross-sectional schematic side view of the assembly 300 along line L3-L3 shown in FIG. 4A, which illustrates the initial position of the laser chip 200 in the X and Z directions relative to the photonics chip 100 following an initial placement stage in which the laser chip 200 is initially placed within the recessed cavity 104 of the photonics chip 100. FIG. 6B is a partial cross-sectional schematic side view the assembly 300 along line L4-L4 shown in FIG. 4B following completion of the solder reflow process in which the photonics chip 100 and the laser chip 200 are self-aligned to each other at target positions in the X and Z directions.

Referring collectively to FIGS. 4A, 5A and 6A, an initial step of a flip-chip assembly process according to an embodiment of the invention includes placing the laser chip 200 within the recessed cavity 104 of the photonics chip 100. In one embodiment of the invention, this step is performed using any standard pick and place tool/process for flip-chip technologies following a wafer dicing process. In general, wafer dicing involves mounting a wafer (which comprises a plurality of the laser chips 200 formed thereon, for example) on a cutting ring, stretching wafer tape over back of the wafer, mounting the wafer on a dicing chuck, and cutting the wafer into individual dies (e.g., individual laser chips) using a diamond blade. With the wafer dicing process, the wafer is cut into individual dies without cutting through the wafer tape so that the individual dies remain attached to the wafer tape after the dicing process. Following wafer dicing, a pick and place machine (semi-automated or fully automated) is used to lift an individual die (e.g., laser chip 200) from the wafer tape (via a vacuum collet), and place the die onto a substrate, package, or other die stack, for example (e.g., place a laser chip 200 on the photonics chip 100). With an automated pick and place tool, the X and Y positioning is performed automatically using a pattern recognition system.

As shown in FIGS. 4A and FIG. 5A, for example, the laser chip 200 is initially placed within the recessed cavity 104 of the photonics chip 100 with the first side edge 202-1 (laser light emitting edge) of the laser chip 200 is disposed at some distance away from the protruding waveguide portions 122 (waveguide interface) which contain the waveguide inputs of the waveguides 120 of the photonics chip 100. This initial distance is based, in part, on the tolerances of the chip dicing (or chip cleaving) process and the tolerance of the chip placement of the pick and place tool used to initially position the laser chip 200 on the photonics chip 100.

For example, as mentioned above, a chip dicing process can have a tolerance of about +/−15 μm in the size of the diced chip, and a pick and place tool can have an alignment accuracy tolerance of +/−10 μm. In this regard, for a worst-case scenario, a tolerance of +/−25 micron could exist because of the dicing and alignment tolerances. Therefore, in one embodiment of the invention, as schematically shown in FIGS. 4A and 5A, for the initial placement of the laser chip 200, the bonding pads 210 (e.g., bonding pads 210-3 and 210-4) of the laser chip 200 can be intentionally misaligned at a distance D1 of 25 μm or more from the edges of the corresponding bonding pads 110 (e.g., respective bonding pads 110-3 and 110-4) of the photonics chip 100 in the Y direction.

Moreover, based on an alignment accuracy tolerance of +/−10 μm for the placement process, in one embodiment of the invention, as schematically shown in FIGS. 4A and 6A, the bonding pads 210 (e.g., bonding pads 210-1 and 210-2) of the laser chip 200 can be intentionally misaligned at a distance D2 of 10 μm or more from the edges of the corresponding bonding pads 110 (e.g., respective bonding pads 110-1 and 110-2) of the photonics chip 100 in the X direction.

The maximum amount of misalignment (for the initial placement) between the bonding pads 210 of the laser chip 200 and the corresponding bonding pads 110 of the photonics chip 100 can vary depending on the pitch and/or size of the bonding pads 110 and 210 in the X and Y directions. For example, the misalignment of corresponding bonding pads 110 and 210 should not be too large so as to prevent solder wetting of the bonding pads 210 on the laser chip 200 with the solder 130 on the corresponding bonding pads 110 of the photonics chip 100, or otherwise allow solder 130 on a given bonding pad 110 to wet the corresponding bonding pad 210 and a neighboring one of the bonding pads 210 on the laser chip 200.

With regard to alignment in the Z direction, FIGS. 5A and 6A, for example, show that the bottom surface 202-3 of the laser chip 200 makes contact to the top surface of the vertical standoff structures 106-1, 106-3, and 108. As such, after the pick and placement process, the laser chip 200 rests on top of the vertical standoff structures. This vertical positioning is possible because the overall height H2 of the each solder 130/bonding pad 110 structure is less than the height H1 of the vertical standoff structures 106-1, 106-3, and 108, thereby providing a gap G between the solder 130 and the corresponding bonding pads 210 on the bottom surface 202-3 of the laser chip 200.

In the vertical positioning shown in FIG. 5A, the laser waveguides 220 of the laser chip 200 are aligned (in the vertical Z direction) to the waveguides 120 of the photonics chip 100. This is because the distance H3 between the laser waveguides 220 and the bottom surface 202-3 of the laser chip 200 is equal to the vertical height H3 from the top of the vertical standoff structures 106-1, 106-3, and 108 to the waveguides 120 of the photonics chip 100.

After the pick and placement process is completed, a solder reflow process is initiated. As depicted in FIG. 5B, when the flat electroplated solders 130 begin to melt during the initial phase of the solder reflow process, the flat electroplated solders 130 become ball-shaped, which causes the solders 130 to make contact to corresponding ones of the bonding pads (e.g., bonding pads 210-3, 210-4) on the bottom surface 202-3 of the laser chip 200.

Once the molten solders 130 touch the bonding pads 210 of the laser chip 200, the molten solders 130 start wetting and spreading on the bonding pads 210. During reflow, the surface tension forces of the melted solder 130 on the bonding pads 210 of the laser chip 200 are effective to induce movement of the laser chip 200 in the X and Y directions to minimize the surface energy of the molten solder 130. In particular, as shown in FIG. 5C, the laser chip 200 is moved in the Y direction until the first side edge 202-1 of the laser chip 200 is butted against the protruding waveguide portions 122 of the photonics chip 100. Moreover, as shown in FIG. 6B, the laser chip 200 is moved in the X direction until the alignment stop 208 on the bottom surface 202-3 of the laser chip 200 is butted against the vertical standoff structure 108.

Once the first side edge 202-1 of the laser chip 200 is butted against the protruding waveguide portions 122 (FIG. 5C) and the alignment stop 208 is butted against the vertical standoff structure 108 (FIG. 6B), the laser chip 200 will be aligned to the photonics chip 100 in both the X and Y directions. In this state of XY alignment, as depicted in FIG. 4B, the outputs of the laser waveguides 220-1, 220-2, 220-3, 220-4, 220-5, 220-6, 220-7, and 220-8 of the laser chip 200 are aligned to, and in contact with, the inputs to the corresponding waveguides 120-1, 120-2, 120-3, 120-4, 120-5, 120-6, 120-7, and 120-8 in the protruding waveguide portions 122 of the photonics chip 100.

As shown in FIGS. 4B, 5C and 6B, after solder reflow and alignment of the laser chip 200 and photonics chip 100, there remains some misalignment of the bonding pads 110 of the photonics chip 100 and corresponding bonding pads 210 of the laser chip 200 in both the X and Y directions. This resulting misalignment between the corresponding bonding pads 110 and 210 in both the X and Y directions ensures that the laser chip 200 will continue movement in the X and Y directions until contact is made between the first side edge 202-1 of the laser chip 200 and the protruding waveguide portions 122 (Y direction alignment) and the alignment stop 208 is butted against the vertical standoff structure 108 (X direction alignment). Indeed, based on the pulling surface tension forces, movement in either the X or Y direction would essentially stop in the X or Y direction if the edges of the corresponding bonding pads 110 and 210 were aligned in the X or Y direction. Therefore, by preventing the alignment of the edges of corresponding bonding pads 110 and 120, movement of the laser chip 200 in the X and Y directions is ensured to continue until mechanically stopped by the contact mechanism described above.

With regard to alignment in the Z direction, during the solder reflow process, the surface tension forces of the melted solder 130 on the bonding pads 210 of the laser chip 200 are effective to maintain the bottom surface 202-3 of the laser chip 200 in slidable contact with the top surfaces of the vertical standoff structures 106-1, 106-2, 106-3, 106-4 and 108 while the laser chip 200 laterally moves in the X and Y directions and slides on top of the vertical standoff structures 106-1, 106-2, 106-3, 106-4 and 108. Therefore, Z alignment is effectively maintained during the entire assembly process from placement to solder reflow and final self-alignment. For example, as shown in FIGS. 5C and 6B, after solder reflow, the laser waveguides 220-1, 220-2, 220-3, 220-4, 220-5, 220-6, 220-7, and 220-8 of the laser chip 200 are vertically aligned to the corresponding waveguides 120-1, 120-2, 120-3, 120-4, 120-5, 120-6, 120-7, and 120-8.

The movement of the laser chip 200 in the X and Y directions during solder reflow and the XY alignment results can depend on frictional forces between the bottom surface 202-3 of the laser chip 200 and the top surface of the vertical standoff structures 106-1, 106-2, 106-3, 106-4 and 108. Therefore, to minimize frictional forces between the bottom surface 202-3 of the laser chip 200 and the top surfaces of the vertical standoff structures 106-1, 106-2, 106-3, 106-4 and 108 during solder reflow, known semiconductor fabrication techniques can be utilized to clean the surfaces of the vertical standoff structures 106-1, 106-2, 106-3, 106-4 and 108 following certain fabrication steps, such as, e.g., the deep RIE (Reactive Ion Etching) process used to form the recessed cavity 104 and vertical standoff structures, and the solder electroplating process which includes deposition of seed layers and etching steps.

In one embodiment of the invention, a vapor phase flux, such as formic acid, is used during the solder reflow process (as opposed to a liquid type flux). The use of a vapor phase flux such as formic acid enables removal of Sn oxide during the solder reflow process, while eliminating the creation of flux residues that would otherwise be generated with a liquid type flux. Such flux residues could increase the friction between the bottom surface 202-3 of the laser chip 200 and the top surfaces of the vertical standoff structures 106-1, 106-2, 106-3, 106-4 and 108 during the solder reflow process, and impede movement of the laser chip 200 and, thus, prevent proper XY alignment.

Moreover, for optical applications, the flux residues and outgoing gases that are created using a liquid type flux are not compatible with good optical performance. By using a vapor phase flux such as formic acid, no flux residues are generated and no cleaning of flux residue is required. Therefore, after solder reflow, a next phase in the assembly process, e.g., dispensing of optical under-fill material between the aligned laser chip 200 and photonics chip 100, can be performed without having to perform a flux residue cleaning process.

As explained in further detail below, a critical parameter in the flip-chip assembly process is the amount of solder 130 that is deposited on the metallic bonding pads 110 and the gap G (see FIG. 5A, 6A) between the solder 130 and the metallic bonding pad 210 on the bottom surface 202-3 of the laser chip 200. Compared to 1D (Y direction only) and 2D (YZ direction) self-alignment, a 3D (XYZ direction) self-alignment process according to an embodiment of the invention has a more narrow process window and various parameters must be considered. Through experimentation and calculations, we have determined lateral and vertical surface tension forces of the solder as a function of the amount of the solder between the bonding pads 110 and 210. As noted above, the overall height H2 of the electroplated solder 130/bonding pad 100 structure should be smaller than the height H1 of the vertical standoff structures such that when the solders 130 melt and wet the bonding pads 210 of the laser chip 200, the surface tension of the melting solders will exert a pulling force on the laser chip 200 in the X, Y and Z directions.

We have found through experimentation and calculation that the size of the gap G (which is related to the amount of solder 130) is critical to generate the correct amount of lateral and vertical forces to enable effective slidable movement of a chip in the X and Y directions as it slides over the vertical standoff structures and to maintain the chip against the top surface of the vertical standoff structures. With large gap G sizes (or small amount of solder), the lateral force (in X and Y direction) decreases to zero and at small gap G sizes (or large amount of solder), the vertical force (in Z direction) decreases to zero. Based on these calculations and models, we have determined that an ideal gap G size is a function of the height H1 of the vertical standoff structures as follows: $0.15 \times H1 < G < 0.25 \times H1$. For example, in the embodiment shown in FIG. 5A, assuming that the height H1 of the vertical standoff structures (e.g., vertical standoff structure 106-3) is 10 μm, then an ideal gap G would be in a range of about 1.50 μm to about 2.50 μm. This ideal gap G would be sufficient to provide the desired lateral and vertical forces that enable proper alignment in the X, Y and Z directions for H1=10 μm.

Through experimentation we have determined that XYZ alignment methods according to embodiments of the invention as described herein advantageously provide alignment accuracy below 1.0 micron in the X, Y and Z directions. The exemplary flip-chip assembly alignment methods take into account cleaving or dicing tolerance of a chip, e.g., laser chip 200, wherein alignment between critical edges of chips (e.g., waveguide alignment) is achieved using chip butting, for example. For optical applications, the alignment methods discussed herein enable accurate alignment between laser chips and Si nanophotonic chips, commensurate with single-mode optics, despite the low alignment accuracy (+/−10 μm) provided by standard high speed pick and place tools.

Although embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A method for assembling a semiconductor device, comprising:
providing a first chip comprising a cavity region defined by a recessed surface and a sidewall surface, wherein the first chip comprises an array of first bonding pads formed on the recessed surface of the first chip, wherein solder is disposed on the first bonding pads, wherein the first chip comprises a plurality of vertical standoff structures disposed on the recessed surface of the first chip, and wherein the first chip comprises first circuit components disposed on the sidewall surface;
providing a second chip, wherein the second chip comprises an array of second bonding pads and an alignment stop formed on a surface of the second chip, wherein the array of second bonding pads corresponds to the array of first bonding pads, and wherein the second chip comprises second circuit components disposed on a side surface of the second chip;
placing the second chip into an initial position in the cavity of the first chip with the array of second bonding pads facing the array of first bonding pads and with the second chip resting on top of the plurality of vertical standoff structures, wherein in the initial position, the first and second array of bonding pads are misaligned in a lateral X direction, and misaligned in a lateral Y direction, and wherein in the initial position, the first and second components are aligned in a vertical Z direction;
performing a solder reflow process to cause the solder on the first bonding pads to contact corresponding ones of the second bonding pads of the second chip and cause the second chip to move in both the lateral X and Y directions while sliding along the top surfaces of the vertical standoff structures, to thereby align the second circuit components of the second chip with the first circuit components of the first chip in the X, Y and Z directions,
wherein alignment is obtained in the X direction by contact between the alignment stop and at least one of the vertical standoff structures, and wherein alignment is obtained in the Y direction by contact between the sidewall surface of the first chip and the side surface of the second chip.

2. The method of claim 1, wherein the first chip comprises a photonics chip and the second chip comprises a semiconductor laser chip.

3. The method of claim 1, wherein the first circuit components comprise a plurality of semiconductor waveguide structures having inputs exposed on the sidewall surface of the first chip, and wherein the second circuit components comprise semiconductor waveguides having outputs exposed on the side surface of the second chip.

4. The method of claim 1, wherein in the initial position, a gap exists between the solder and second bonding pads of the second chip, wherein a size G of the gap is in a range of $0.15 \times H1 < G < 0.25 \times H1$, wherein H1 is a height of the vertical standoff structures.

5. The method of claim 1, wherein the solder reflow process is performed using a vapor phase flux.

6. The method of claim 1, wherein upon alignment of the first and second circuit components in the X, Y and Z directions, there remains misalignment between corresponding ones of the first and second bonding pads in at least one of the X direction and Y direction.

7. The method of claim 1, wherein the at least one vertical standoff structure which contacts the alignment stop has a larger cross-sectional area than other vertical standoff structures that do not contact the alignment stop.

8. The method of claim 1, wherein the first circuit components are disposed in protruding portions formed on the sidewall surface of the first chip.

9. The method of claim 1, wherein in the initial position, the first and second array of bonding pads are misaligned in the lateral X and Y directions in an amount greater than about 10 μm.

10. The method of claim 1, wherein during the solder reflow process, alignment between the first and second circuit components in the Z direction is maintained by keeping the surface of the second chip in contact with the top surface of the vertical standoff structures.

11. A semiconductor device that is fabricated using a method comprising:
providing a first chip comprising a cavity region defined by a recessed surface and a sidewall surface, wherein the first chip comprises an array of first bonding pads formed on the recessed surface of the first chip, wherein solder is disposed on the first bonding pads, wherein the first chip comprises a plurality of vertical standoff structures disposed on the recessed surface of the first chip, and wherein the first chip comprises first circuit components disposed on the sidewall surface;
providing a second chip, wherein the second chip comprises an array of second bonding pads and an alignment stop formed on a surface of the second chip, wherein the array of second bonding pads corresponds to the array of first bonding pads, and wherein the second chip comprises second circuit components disposed on a side surface of the second chip;
placing the second chip into an initial position in the cavity of the first chip with the array of second bonding pads facing the array of first bonding pads and with the second chip resting on top of the plurality of vertical standoff structures, wherein in the initial position, the first and second array of bonding pads are misaligned in a lateral X direction, and misaligned in a lateral Y direction, and wherein in the initial position, the first and second components are aligned in a vertical Z direction;
performing a solder reflow process to cause the solder on the first bonding pads to contact corresponding ones of the second bonding pads of the second chip and cause the second chip to move in both the lateral X and Y directions while sliding along the top surfaces of the vertical standoff structures, to thereby align the second circuit components of the second chip with the first circuit components of the first chip in the X, Y and Z directions,
wherein alignment is obtained in the X direction by contact between the alignment stop and at least one of the vertical standoff structures, and wherein alignment is obtained in the Y direction by contact between the sidewall surface of the first chip and the side surface of the second chip.

12. The semiconductor device of claim 11, wherein the first chip comprises a photonics chip and the second chip comprises a semiconductor laser chip.

13. The semiconductor device of claim 11, wherein the first circuit components comprise a plurality of semiconductor waveguide structures having inputs exposed on the sidewall surface of the first chip, and wherein the second circuit components comprise semiconductor waveguides having outputs exposed on the side surface of the second chip.

14. The semiconductor device of claim 11, wherein in the initial position, a gap exists between the solder and second bonding pads of the second chip, wherein a size G of the gap is in a range of $0.15 \times H1 < G < 0.25 \times H1$, wherein H1 is a height of the vertical standoff structures.

15. The semiconductor device of claim 11, wherein the solder reflow process is performed using a vapor phase flux.

16. The semiconductor device of claim 11, wherein upon alignment of the first and second circuit components in the X, Y and Z directions, there remains misalignment between corresponding ones of the first and second bonding pads in at least one of the X direction and Y direction.

17. The semiconductor device of claim 11, wherein the at least one vertical standoff structure which contacts the alignment stop has a larger cross-sectional area than other vertical standoff structures that do not contact the alignment stop.

18. The semiconductor device of claim 11, wherein the first circuit components are disposed in protruding portions formed on the sidewall surface of the first chip.

19. The semiconductor device of claim 11, wherein in the initial position, the first and second array of bonding pads are misaligned in the lateral X and Y directions in an amount greater than about 10 µm.

20. The semiconductor device of claim 11, wherein during the solder reflow process, alignment between the first and second circuit components in the Z direction is maintained by keeping the surface of the second chip in contact with the top surface of the vertical standoff structures.

\* \* \* \* \*